United States Patent
Lu et al.

(10) Patent No.: US 11,864,378 B2
(45) Date of Patent: Jan. 2, 2024

(54) SEMICONDUCTOR DEVICE AND METHOD FOR MANUFACTURING SEMICONDUCTOR DEVICE

(71) Applicant: CHANGXIN MEMORY TECHNOLOGIES, INC., Hefei (CN)

(72) Inventors: Yong Lu, Hefei (CN); Gongyi Wu, Hefei (CN); Hongkun Shen, Hefei (CN); Qiuhu Pang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 187 days.

(21) Appl. No.: 17/440,827

(22) PCT Filed: Jun. 29, 2021

(86) PCT No.: PCT/CN2021/103128
§ 371 (c)(1),
(2) Date: Sep. 20, 2021

(87) PCT Pub. No.: WO2022/057369
PCT Pub. Date: Mar. 24, 2022

(65) Prior Publication Data
US 2023/0053627 A1    Feb. 23, 2023

(30) Foreign Application Priority Data
Sep. 16, 2020  (CN) .......................... 202010973871.7

(51) Int. Cl.
*H10B 12/00*   (2023.01)
*H01L 21/762*  (2006.01)
(Continued)

(52) U.S. Cl.
CPC ..... *H10B 12/488* (2023.02); *H01L 21/76224* (2013.01); *H01L 23/53271* (2013.01);
(Continued)

(58) Field of Classification Search
CPC .... H10B 12/053; H10B 12/488; H10B 12/34; H01L 21/76224; H01L 29/0607
See application file for complete search history.

(56) References Cited

U.S. PATENT DOCUMENTS 6,989,560 B2    1/2006   Koike et al.
7,465,989 B2   12/2008   Hayashi
(Continued)

FOREIGN PATENT DOCUMENTS

CN    1377091 U    10/2002
CN   101154685 A   4/2008
(Continued)

OTHER PUBLICATIONS

Machine translation of CN-208738255-U (Year: 2019).*
International Search report PCT/CN2021/103128, dated Sep. 28, 2021, 9 pages.

*Primary Examiner* — Mary A Wilczewski
*Assistant Examiner* — Jaesun Lee
(74) *Attorney, Agent, or Firm* — Cooper Legal Group, LLC

(57) ABSTRACT

The present disclosure discloses a semiconductor device and a method for manufacturing a semiconductor device. The method for manufacturing a semiconductor device includes following steps: providing a semiconductor substrate, and forming active regions and trench isolation structures in the semiconductor substrate, wherein the trench isolation structures are located between the active regions; forming first grooves in the active regions; filling the first grooves to form inversion polysilicon layers, the inversion polysilicon layers being inversely doped with the active regions; forming second grooves, the second grooves running through the polysilicon layers and a part of the semiconductor substrate, and reserving parts of the inversion polysilicon layers (Continued)

located on side faces of the second grooves; and, forming buried word line structures in the second grooves.

8 Claims, 6 Drawing Sheets

(51) Int. Cl.
    *H01L 23/532*     (2006.01)
    *H01L 29/06*     (2006.01)
    *H01L 29/78*     (2006.01)

(52) U.S. Cl.
    CPC .......... *H01L 29/0607* (2013.01); *H01L 29/78* (2013.01); *H10B 12/053* (2023.02); *H10B 12/34* (2023.02)

(56) References Cited

U.S. PATENT DOCUMENTS

| | | | | |
|---|---|---|---|---|
| 7,956,387 | B2 | 6/2011 | Schloesser | |
| 8,557,662 | B2 * | 10/2013 | Lee | H01L 21/743 438/270 |
| 8,735,269 | B1 * | 5/2014 | Sun | H01L 29/66545 438/592 |
| 8,836,001 | B2 * | 9/2014 | Park | H10B 12/482 438/770 |
| 8,916,477 | B2 * | 12/2014 | Thedjoisworo | H01L 21/3065 438/719 |
| 9,748,248 | B2 * | 8/2017 | Kang | H01L 29/785 |
| 10,037,997 | B1 * | 7/2018 | Kang | H01L 29/66628 |
| 10,153,284 | B2 * | 12/2018 | Kang | H01L 21/823418 |
| 10,553,692 | B2 * | 2/2020 | Kim | H01L 29/105 |
| 10,741,643 | B2 * | 8/2020 | Ryu | H01L 29/66621 |
| 10,964,794 | B2 * | 3/2021 | Yoo | H01L 21/28105 |
| 11,075,257 | B2 * | 7/2021 | Cho | H10K 59/131 |
| 11,276,761 | B2 * | 3/2022 | Kim | H01L 29/517 |
| 11,380,761 | B2 * | 7/2022 | Ryu | H01L 21/28088 |
| 11,600,710 | B2 * | 3/2023 | Kim | H01L 29/517 |
| 2007/0004126 | A1 | 1/2007 | Jang | |
| 2011/0018057 | A1 | 1/2011 | Kim | |
| 2020/0203353 | A1 | 6/2020 | Liu | |
| 2020/0395455 | A1 * | 12/2020 | Kim | H10B 12/488 |

FOREIGN PATENT DOCUMENTS

| | | | | |
|---|---|---|---|---|
| CN | 101174648 A | | 5/2008 | |
| CN | 107068683 A | | 8/2017 | |
| CN | 107425072 A | | 12/2017 | |
| CN | 108987282 A | | 12/2018 | |
| CN | 208738255 U | * | 4/2019 | ........... H01L 29/423 |
| CN | 110649021 A | * | 1/2020 | ....... H01L 21/26513 |
| CN | 110896077 A | | 3/2020 | |

* cited by examiner

SEMICONDUCTOR DEVICE AND METHOD FOR MANUFACTURING SEMICONDUCTOR DEVICE

CROSS-REFERENCE TO RELATED APPLICATIONS

The present disclosure claims the priority to Chinese Patent Application 202010973871.7, titled "SEMICONDUCTOR DEVICE AND METHOD FOR MANUFACTURING SEMICONDUCTOR DEVICE", filed to China National Intellectual Property Administration on Sep. 16, 2020, which is incorporated herein by reference in its entirety.

TECHNICAL FIELD

The present disclosure relates to, but not limited to, a semiconductor device and a method for manufacturing a semiconductor device.

BACKGROUND

As a semiconductor device commonly used in electronic devices such as computers, the dynamic random access memory (DRAM) comprises a memory unit array configured to store data and a peripheral circuit located at the periphery of the memory unit array. Each memory unit usually comprises a transistor (word line), a bit line and a capacitor. The word line voltage on the transistor (word line) can control the on or off of the transistor, so that the data information stored in the capacitor can be read through the bit line or the data information can be written into the capacitor through the bit line.

With the continuous development of the manufacturing process, the transistor becomes smaller, and the electric field intensity of channels in the MOS device is increasing. As the process node for the DRAM reaches 20 nm or below, the substrate leakage current and the gate-induced drain leakage (GIDL) current of the MOS device also become more and more serious, resulting in the drifting of switching characteristics of the word line transistor and seriously reducing the device performance and reliability.

SUMMARY

The following is the summary of the subject described in detail herein. This summary is not intended to limit the protection scope defined by the claims.

The present disclosure discloses a method for manufacturing a semiconductor device, comprising following steps: providing a semiconductor substrate, and forming active regions and trench isolation structures in the semiconductor substrate, wherein the trench isolation structures are located between the active regions; forming first grooves in the active regions; filling the first grooves to form inversion polysilicon layers, the inversion polysilicon layers being inversely doped with the active regions; forming second grooves, the second grooves running through the polysilicon layers and a part of the semiconductor substrate, and reserving parts of the inversion polysilicon layers located on side faces of the second grooves; and, forming buried word line structures in the second grooves.

The present disclosure further provides a semiconductor device.

The semiconductor device according to the embodiments of the present disclosure comprises: a semiconductor substrate, having active regions and trench isolation structures located between the active regions; buried word line structures, located in the active regions; and, inversion polysilicon layers, located on side faces of the buried word line structures and inversely doped with the active regions.

Other aspects will become apparent upon reading and understanding the drawings and detailed description.

BRIEF DESCRIPTION OF THE DRAWINGS

The drawings incorporated into the specification and constituting a part of the specification show the embodiments of the present disclosure, and are used with the description to explain the principles of the embodiments of the present disclosure. Throughout the drawings, like reference numerals denote like elements. The drawings to be described hereinafter are some but not all of the embodiments of the present disclosure. A person of ordinary skill in the art can obtain other drawings according to these drawings without paying any creative effort.

DETAILED DESCRIPTION

The method for manufacturing a semiconductor device according to the present disclosure will be described below by specific implementations with reference to the drawings.

Figure 1:
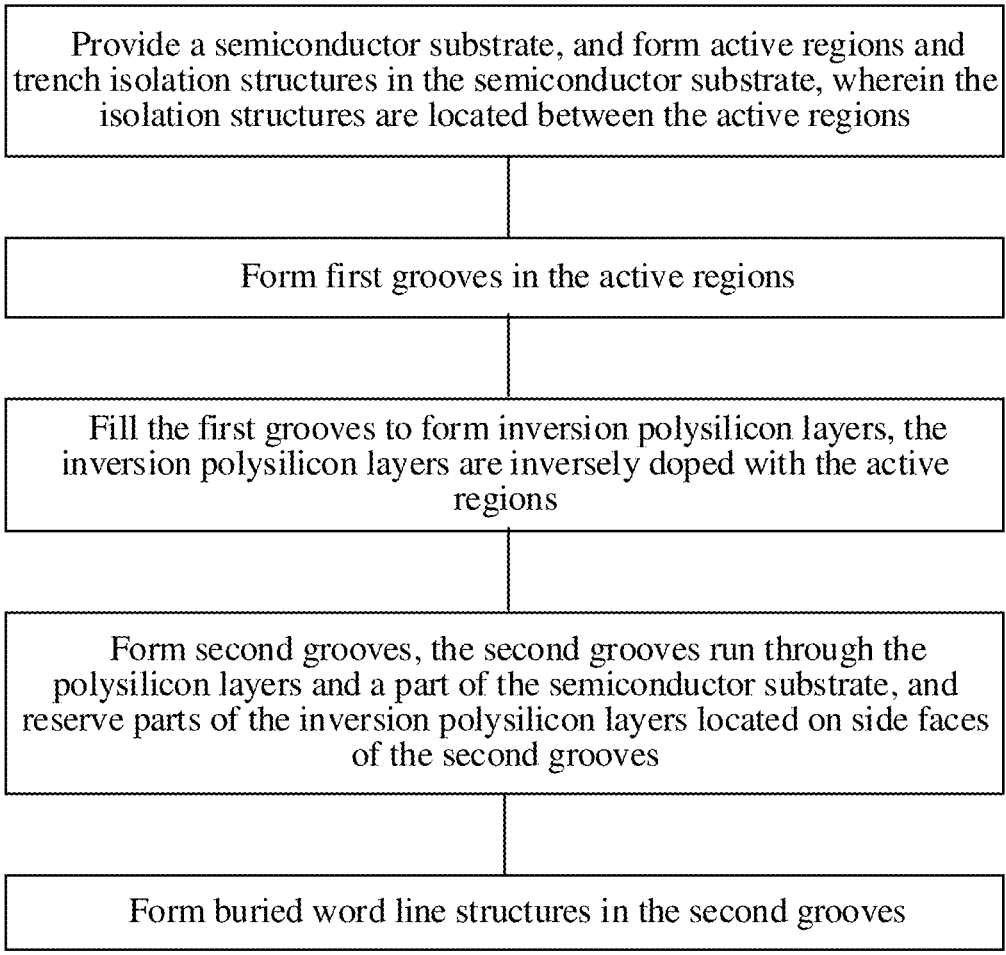
FIG. 1 is a flowchart of a method for manufacturing a semiconductor device according to an embodiment of the present disclosure.

As shown in FIG. 1, the method for manufacturing a semiconductor device 100 according to an embodiment of the present disclosure may comprise following steps: providing a semiconductor substrate 1, and forming active regions 12 and trench isolation structures 11 in the semiconductor substrate 1, wherein the trench isolation structures are located between the active regions 12; forming first grooves 31 in the active regions 12; filling the first grooves 31 to form inversion polysilicon layers 3, the inversion polysilicon layers are inversely doped with the active regions 12; forming second grooves 32, the second grooves 32 running through the inversion polysilicon layers 3 and a part of the semiconductor substrate 1, and reserving parts of the inversion polysilicon layers 3 located on side faces of the second grooves 32; and, forming buried word line structures 20 in the second grooves 32.

As shown in FIGS. 2-10, sectional views of the steps in the method for manufacturing a semiconductor device 100 according to an embodiment of the present disclosure are shown.

Figure 2:
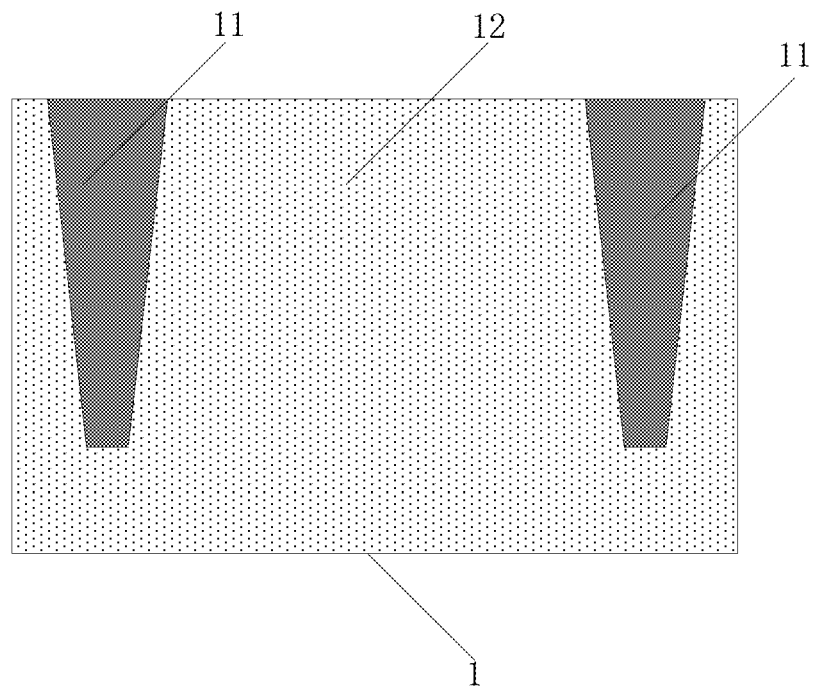
FIG. 2 is a sectional view of a step of providing a semiconductor substrate of the semiconductor device according to an embodiment of the present disclosure.

As shown in FIG. 2, a semiconductor substrate 1 is provided. The material for the semiconductor substrate 1 may be Si, Ge, GeSi or SiC, or may be silicon on insulator (SOI) or germanium on insulator (GOI), or may be other materials, for example, III-V family compounds such as gallium arsenide.

Trench isolation structures 11 are provided in the semiconductor substrate 1, and a plurality of active regions 12 are isolated in the semiconductor substrate 1 by the trench isolation structures 11. The trench isolation structures 11 may comprise trenches and an insulating material filled in the trenches. The insulating material may be silicon oxide, etc. The active regions 12 may be doped with ions by an ion implantation or diffusion process to form P-type active regions 12 or N-type active regions 12. Source regions and drain regions are formed in the active regions 12, and the source regions and drain regions are inversely doped with the active regions 12. For example, if the active regions 12 are formed as P-type active region 12, the source regions and drain region are N-doped; and, if the active regions 12 are formed as N-type active regions 12, the source regions and drain regions are P-doped.

Figure 3:
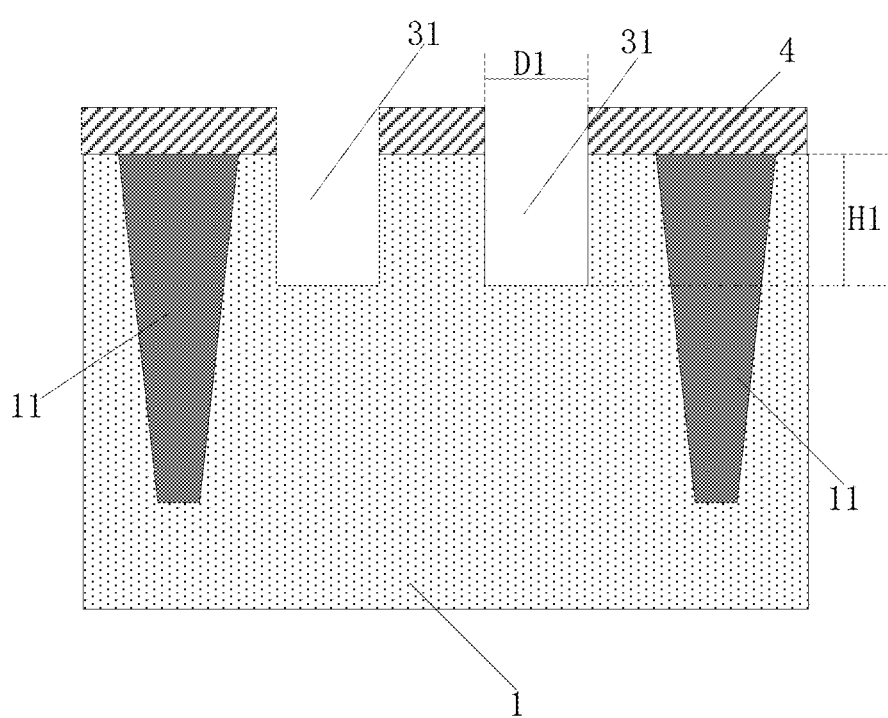
FIG. 3 is a sectional view of a step of forming first grooves on the semiconductor substrate according to an embodiment of the present disclosure.

As shown in FIG. 3, first grooves 31 are formed in the active regions. Before the first grooves 31 are formed, a patterned mask layer 4 may be formed on the surface of the semiconductor substrate 1. The active regions 12 of the semiconductor substrate 1 are patterned by the mask layer 4 so as to form first grooves 31 in the active regions 12. There may be a plurality of first grooves 31. For example, as shown in FIG. 3, two first grooves 31 may be formed. For the mask layer 4, the material for the mask layer 4 may be silicon nitride. The mask layer 4 may be formed by chemical vapor deposition, etc., but it is not limited thereto.

As shown in FIG. 3, a depth of each of the first grooves 31 may be 20 nm to 150 nm, and a width of each of the first grooves 31 may be 30 nm to 100 nm. That is, if the width of the first grooves 31 may be D1 and the depth of the first grooves 31 may be H1, D1 satisfies the following condition: 30 nm≤D1≤100 nm, and H1 satisfies the following condition: 20 nm≤H1≤150 nm.

Figure 4:
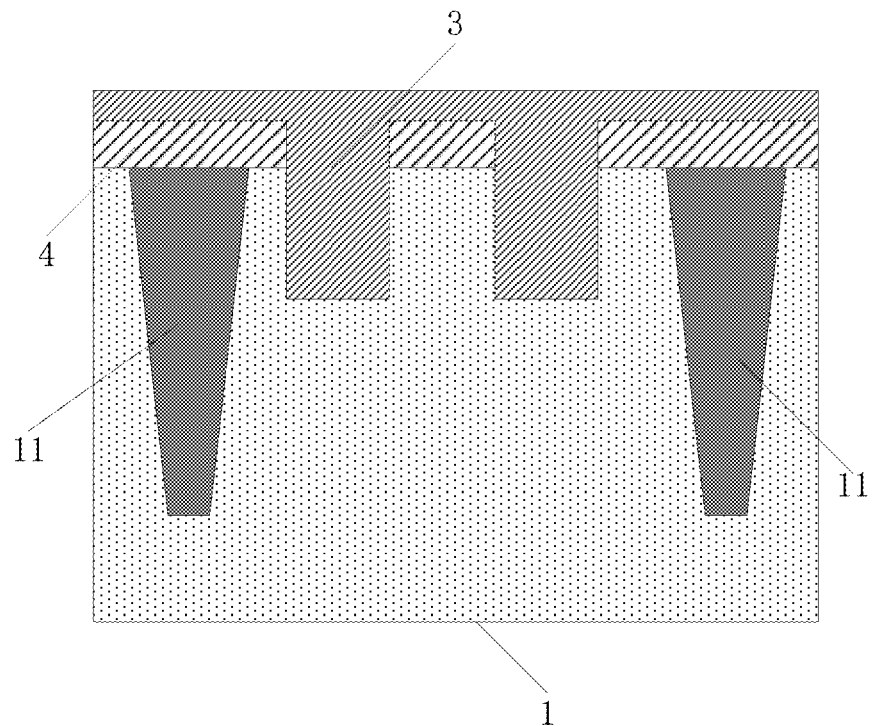
FIG. 4 is a sectional view of a step of filling inversion polysilicon layers in the first grooves according to an embodiment of the present disclosure.

As shown in FIG. 4, the first grooves 31 are filled to form inversion polysilicon layers 3, the inversion polysilicon layers are inversely doped with the active regions 12. polysilicon layers filling the first grooves 31 are formed on the surface of the semiconductor substrate 1, and the polysilicon layers are doped with ions to form the polysilicon layers 3. The ion doping of the inversion polysilicon layers 3 is inversed to the ion doping of the active regions 12. For example, if the active regions 12 are formed as P-type active regions 12, the inversion polysilicon layers 3 are doped with N-type ions, such as arsenic or antimony; and, if the active regions 12 are formed as N-type active regions 12, the inversion polysilicon layers 3 are doped with P-type ions, such as boron or indium. Then, the inversion polysilicon layer 3 on the upper surface of the mask layer 4 is removed, and the inversion polysilicon layers in the first grooves 31 are reserved.

Figure 5:
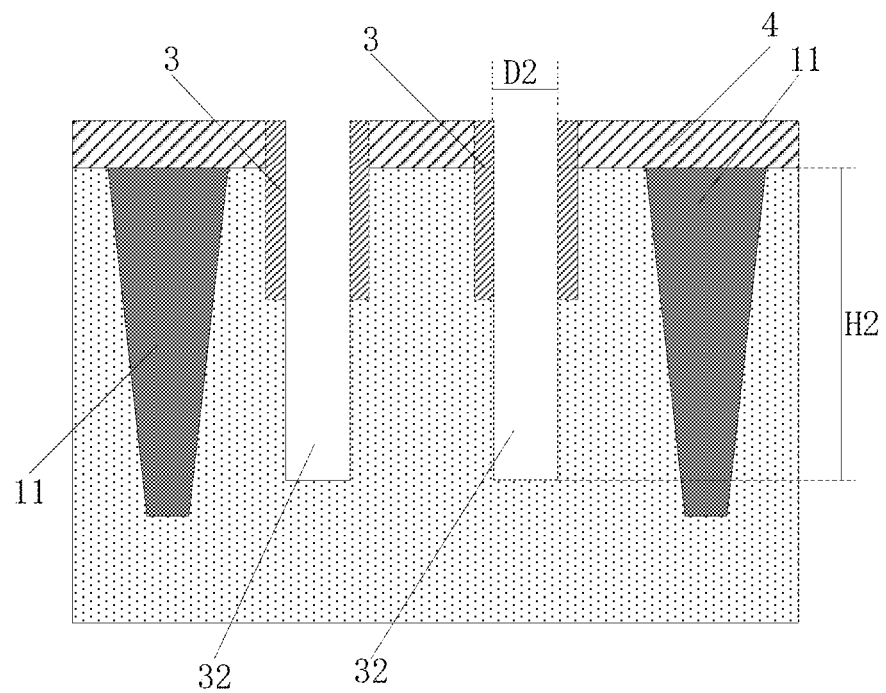
FIG. 5 is a sectional view of a step of forming second grooves on the semiconductor substrate according to an embodiment of the present disclosure.

As shown in FIG. 5, second grooves 32 are formed. The second grooves 32 run through the inversion polysilicon layers 3 and a part of the semiconductor substrate 1, and parts of the inversion polysilicon layers 3 located on side faces of the second grooves 32 are reserved. A depth of each of the second grooves 32 is 50 nm to 300 nm, and a width of each of the second grooves 32 is 20 nm to 50 nm. That is, as shown in FIG. 5, if the width of the second grooves 32 may be D2 and the depth of the second grooves 32 may be H2, D2 satisfies the following condition: 20 nm≤D2≤50 nm, and H2 satisfies the following condition: 50 nm≤H2≤300 nm.

The second grooves 32 are formed in the first grooves 31. The second grooves 32 are formed by etching the inversion polysilicon layers 3 and continuously etching the semiconductor substrate 1 downward in a direction perpendicular to the semiconductor substrate 1. The depth of the second grooves 32 is greater than that of the first grooves 31, and the width of the second grooves 32 is less than that of the first grooves 31. In this way, the side walls of the second grooves 32 are formed by parts of the inversion polysilicon layers 3 and part of the semiconductor substrate 1. As shown in FIG. 5, the inversion polysilicon layers 3 are formed in upper portions of the second grooves 32.

As shown in FIGS. 6-10, buried word line structures 20 are formed in the second grooves 32. The buried word line structures 20 are formed in lower portions of the second grooves 32, and the inversion polysilicon layers 3 are formed in upper portions of the second grooves 32 and located on side faces of the buried word line structures 20. In this way, the source/drain regions of the active regions 12 are formed on sides of the inversion polysilicon layers 3 away from the buried word line structures 20. The source/drain regions can be separated from the buried word line structures 20 by the inversion polysilicon layers 3, and the type of doping of the inversion polysilicon layers 3 is the same as that of the source/drain regions, for example, P-type or N-type, so that a certain electric field can be formed between the drain regions and the inversion polysilicon layers 3. Thus, the intensity of the electric field between the drain regions and the buried word line structures 20 can be reduced, the GIDL current can be reduced, and the turn-on speed of transistors can be improved.

In some embodiments of the present disclosure, the step of forming the buried word line structures 20 comprises: forming gate oxide layers 21 on the surfaces of the second grooves 32; forming gate block layers 22 on the surfaces of the gate oxide layers 21, the gate block layers 22 covering the bottom surfaces and parts of side faces of the gate oxide layers 21; forming gate conductive layers 23 on the surfaces of the gate block layers 22, the gate conductive layers 23 filling parts of the second grooves 32; and, forming insulating filling layers 24 on the gate block layers 22 and the gate conductive layers 23, the insulating filling layers 24 filling the remaining parts of the second grooves 32.

Figure 6:
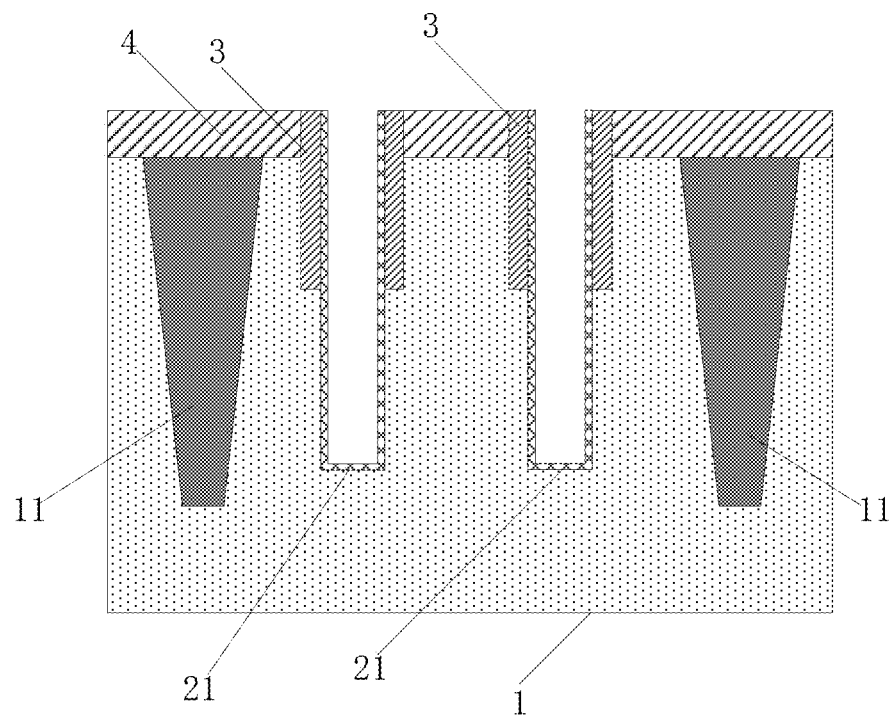
FIG. 6 is a sectional view of a step of forming gate oxide layers on surfaces of the second grooves according to an embodiment of the present disclosure.
Figure 7:
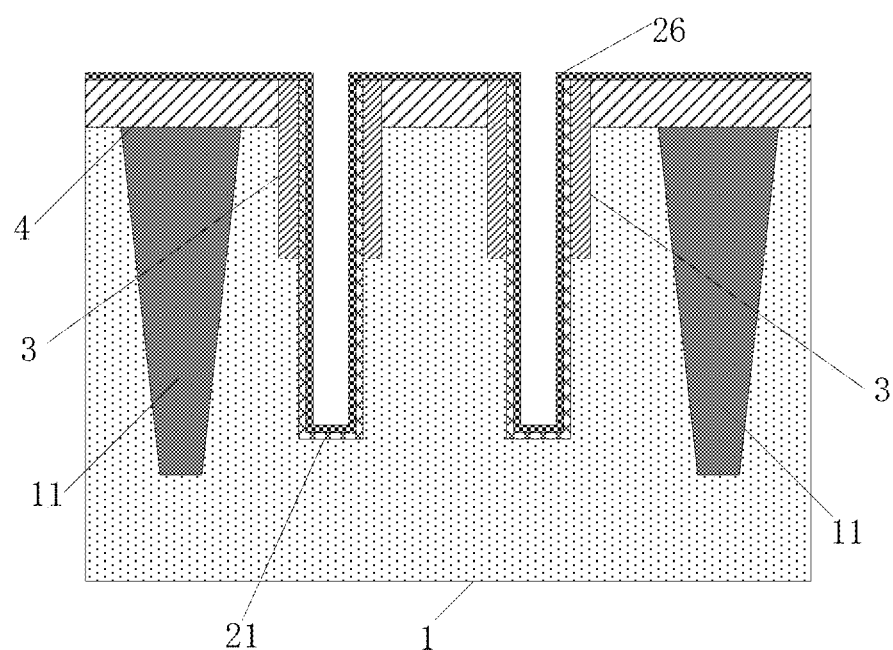
FIG. 7 is a sectional view of a step of forming primary block layers on surfaces of the gate oxide layers and the surface of the mask layer according to an embodiment of the present disclosure.
Figure 8:
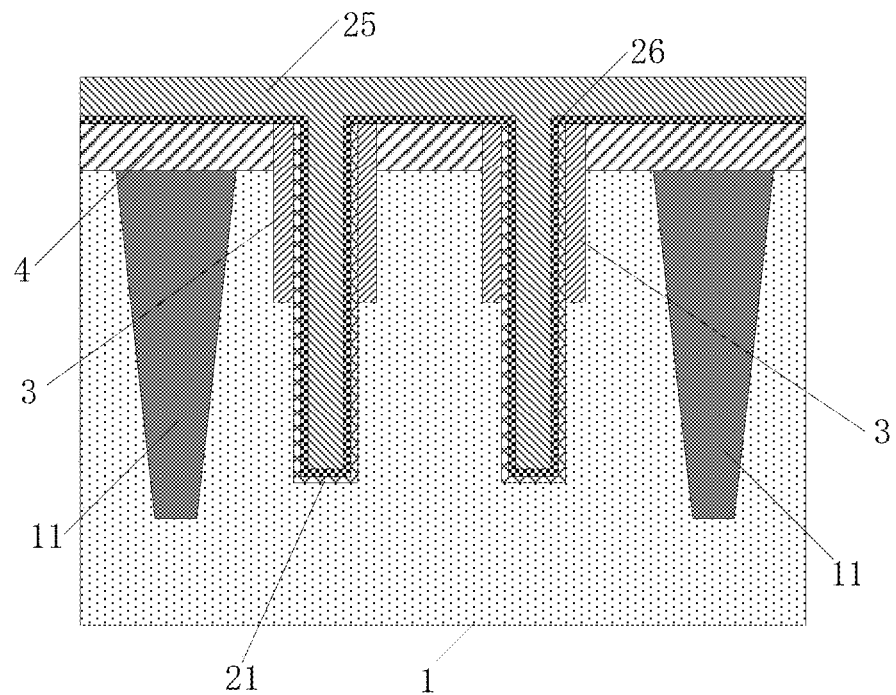
FIG. 8 is a sectional view of a step of forming primary conductive layers on surfaces of the primary block layers and in the second grooves according to an embodiment of the present disclosure.
Figure 9:
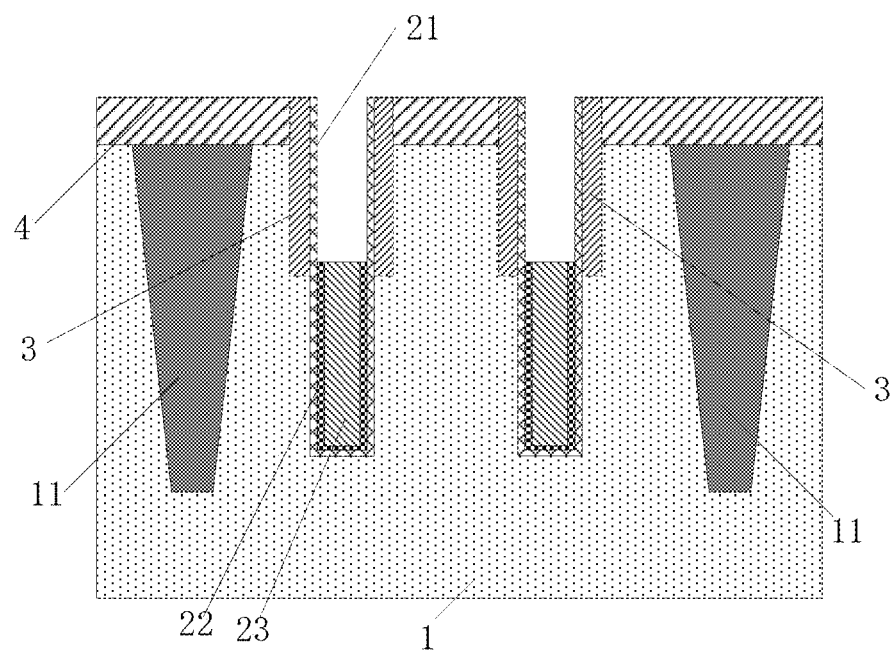
FIG. 9 is a sectional view of a step of removing parts of the primary block layers and the primary conductive layers according to an embodiment of the present disclosure.

As shown in FIG. 6, gate oxide layers 21 are formed on inner walls of the second grooves 32. The gate oxide layers 21 cover the inner walls of the second grooves 32, are flush with the upper surfaces of the inversion polysilicon layers 3 and do not fill the second grooves 32 completely. As shown in FIG. 7, primary block layers 26 are deposited on the surfaces of the gate oxide layers 21 and the surface of the mask layer 4. As shown in FIG. 8, primary conductive layers 25 are formed on the surfaces of the primary block layers 26, and fill the second grooves 32. As shown in FIG. 9, the primary block layers 26 and primary conductive layers 25 on the surface of the mask layer 4 are removed, and the primary block layers 26 and primary conductive layers 25 in the second grooves 32 are reserved. Moreover, the primary block layers 26 and primary conductive layers 25 in the second grooves 32 can be etched back to remove parts of the primary block layers 26 and primary conductive layers 25 in the second grooves 32. Parts of the primary block layers 26 and primary conductive layers 25 on the bottoms of the second grooves 32 are reserved to form the gate block layers 22 and the gate conductive layers 23. The material for the gate block layers 22 may be titanium nitride, and the gate block layers 22 may be formed by atomic layer deposition. The thickness of the gate block layers 22 may be 2 nm to 7 nm, for example, 2 nm, 4 nm, 5 nm, 6 nm, etc.

In the step of removing parts of the primary conductive layers 25 and parts of primary block layers 26, the height of the removed parts of the primary conductive layers 25 and the removed parts of primary block layers 26 is 20 nm to 150 nm, that is, the height of the removed primary conductive layers 25 and primary block layers 26 in the second grooves 32 is greater than or equal to 20 nm and less than or equal to 150 nm. In this way, the height of the removed parts of the primary conductive layers 25 and the removed parts of primary block layers 26 is not more than the height of the inversion polysilicon layers 3, so that the upper surfaces of the formed gate conductive layers 23 and gate block layers 22 are not lower than the lower surfaces of the inversion polysilicon layers 3.

The primary conductive layers 25 may be formed by chemical vapor deposition, and the upper portions of the primary conductive layers 25 and primary block layers 26 are planarized by chemical mechanical polishing. In the step of removing parts of the primary conductive layers 25 and parts of primary block layers 26 located on the mask layer 4 and in the second grooves 32, the primary conductive layers 25 and primary block layers 26 may be etched back by dry etching, and the primary block layers 26 residual on the sidewalls after dry etching are removed by wet etching.

Figure 10:
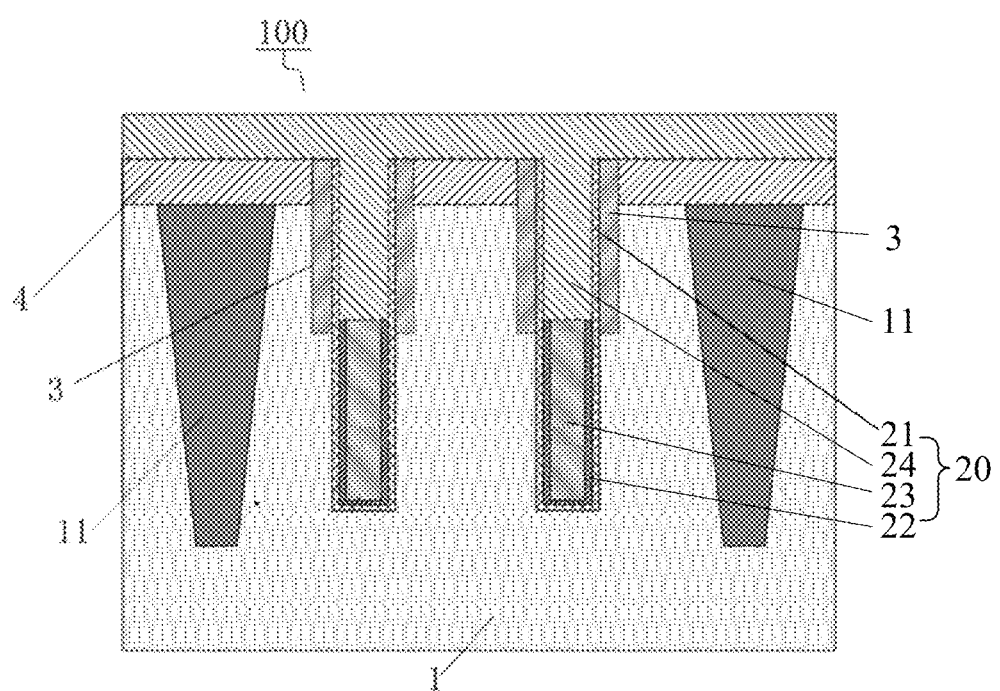
FIG. 10 is a sectional view of the semiconductor device after a step of filling insulating filling layers according to an embodiment of the present disclosure.

As shown in FIG. 10, the upper surfaces of the gate conductive layers 23 are flush with the upper surfaces of the gate block layers 22, and the upper surfaces of the gate block layers 22 are not lower than the lower surfaces of parts of the inversion polysilicon layers 3 located on the side faces of the second grooves 32. That is, the lower surfaces of the inversion polysilicon layers 3 are flush with or lower than the upper surfaces of the gate block layers 22 and the upper surfaces of the gate conductive layers 23. In this way, the inversion polysilicon layers 3 can separate the source/drain regions from the buried word line structures 20, and the inversion polysilicon layers 3 form the overlaps of the buried word line structures 20 with the source/drain regions, so that the GIDL current can be further reduced.

As shown in FIG. 10, after parts of the primary conductive layers 25 and parts of primary block layers 26 in the second grooves 32 are removed to form the gate conductive layers 23 and the gate block layers 22, insulating filling layers 24 filling the upper portions of the second grooves 32 are formed above the gate block layers 22 and the gate conductive layers 23 in the second grooves 32. The material for the insulating filling layers 24 may be silicon nitride, and the insulating filling layers 24 may be formed by chemical vapor deposition. After the insulating filling layers 24 are formed, the surface of the semiconductor device 100 may be planarized by chemical mechanical polishing (CMP).

The semiconductor device 100 according to an embodiment of the present disclosure will be described below with reference to the drawings. The semiconductor device 100 may be formed by the method for manufacturing a semiconductor device described in the above embodiment.

As shown in FIG. 10, the semiconductor device 100 according to the embodiment of the present disclosure may comprise a semiconductor substrate 1, buried word line structures 20 and inversion polysilicon layers 3.

The semiconductor substrate 1 may be made of Si, Ge, GeSi or SiC, or may be made of silicon on insulator (SOI) or germanium on insulator (GOI), or may be made of other materials, for example, III-V family compounds such as gallium arsenide.

Active regions 12 and trench isolation structures 11 located between the active regions 12 are provided in the semiconductor substrate 1. A plurality of trench isolation structures 11 are provided in the semiconductor substrate 1. The plurality of trench isolation structures 11 define a plurality of active regions 12 in the semiconductor substrate 1. The trench isolation structures 11 may comprise trenches and an insulating material filled in the trenches. The insulating material may be silicon oxide, etc.

A plurality of gate structures are formed in the active regions 12. In the embodiments of the present disclosure, the gate structures may be buried word line structures 20 which are formed in the active regions 12. The inversion polysilicon layers 3 are arranged in the active regions 12 and formed on side faces of the buried word line structures 20, and are inversely doped with the active regions 12. The active regions 12 may be doped by an ion implantation or diffusion process. N-type active regions 12 or P-type active regions 12 may be formed by different doping. The inversion polysilicon layers 3 are inversely doped with the active regions 12. For example, if the active regions 12 are P-doped, the polysilicon layers are formed as N-type doped polysilicon layers. If the active regions 12 are N-doped, the polysilicon layers are formed as P-type doped polysilicon layers.

Source/drain regions are formed in the active regions 12 on two sides of the buried word line structures 20 to serve as sources and drains of the buried word line structures 20. The sources/drains have overlaps with the buried word line structures 20. The inversion polysilicon layers 3 are formed on side faces of the buried word line structures 20 and formed between the buried word line structures 20 and/or the sources/drains, and have the same doping type as the sources/drains, so that the GIDL current formed by the drains and the buried word line structures 20 can be reduced, the leakage current of the semiconductor device 100 can be reduced and the performance of the semiconductor device 100 can be improved.

As shown in FIG. 10, the buried word line structures 20 may comprise: gate oxide layers 21, gate block layers 22, gate conductive layers 23 and insulating filling layers 24. The gate block layers 22 are located on the surfaces of the gate conductive layers 23, the insulating filling layers 24 are located on the gate conductive layers 23 and the gate block layers 22, and the gate oxide layers 21 are located on the surfaces of the gate block layers 22 and the insulating filling layers 24.

The upper surfaces of the gate block layers 22 are flush with the upper surfaces of the gate conductive layers 23 and not lower than the lower surfaces of the inversion polysilicon layers 3. In other words, the lower surfaces of the inversion polysilicon layers 3 are flush with or lower than the upper surfaces of the gate block layers 22 and the upper surfaces the gate conductive layers 23. In this way, the source/drain regions can be separated from the buried word line structures 20 by the inversion polysilicon layers 3, and the inversion polysilicon layers 3 form overlaps of the buried word line structures 20 with the source/drain regions, so that the GIDL current can be further reduced.

The upper surfaces of the inversion polysilicon layers 3 are flush with the upper surfaces of the gate oxide layers 21. The thickness of the inversion polysilicon layers 3 is 5 nm to 25 nm, for example, possibly 5 nm, 10 nm, 15 nm, 20 nm, etc., and the height of the inversion polysilicon layers 3 is 20 nm to 150 nm, for example, possibly 20 nm, 40 nm, 70 nm, 100 nm, 130 nm, etc.

The thickness of the gate block layers 22 is 2 nm to 7 nm, for example, possibly 2 nm, 4 nm, 5 nm, 6 nm, etc.

Those skilled in the art will readily think of other embodiments of the present disclosure by considering the specification and practicing the disclosure. The present disclosure is intended to encompass any variations, uses, or adaptive changes of the present disclosure. These variations, uses, or adaptive changes follow the general principles of the present disclosure and include common knowledge or conventional technical means in the technical field that are not disclosed in the present disclosure. The specification and the embodiments are just exemplary, and the true scope and spirit of the present disclosure are defined by the following claims.

It should be understood that the present disclosure is not limited to the precise structures that have been described above and shown in the drawings, and various modifications and changes may be made without departing from its scope. The scope of the present disclosure is defined only by the appended claims.

INDUSTRIAL APPLICABILITY

For the semiconductor device and the method for manufacturing a semiconductor device according to the present disclosure, the method for manufacturing a semiconductor device comprises following steps: forming active regions and trench isolation structures in the semiconductor substrate, wherein the trench isolation structures are located between the active regions; forming first grooves in the active regions; filling the first grooves to form inversion polysilicon layers, the inversion polysilicon layers are inversely doped with the active regions; forming second grooves, the second grooves running through the polysilicon layers and a part of the semiconductor substrate, and reserving parts of the inversion polysilicon layers located on side faces of the second grooves; and, forming buried word line structures in the second grooves. In this way, the source/drain regions of the active regions are formed on sides of the inversion polysilicon layers away from the buried word line structures. The source/drain regions can be separated from the buried word line structures by the inversion polysilicon layers, and the type of doping of the inversion polysilicon layers is the same as that of the source/drain regions, for example, P-type or N-type, so that a certain electric field can be formed between the drain regions and the inversion polysilicon layers. Thus, the intensity of the electric field between the drain regions and the buried word line structures can be reduced, the GIDL current can be reduced, and the turn-on speed of transistors can be improved.

The invention claimed is:

1. A method for manufacturing a semiconductor device, comprising following steps:

providing a semiconductor substrate, and forming active regions and trench isolation structures in the semiconductor substrate, wherein the trench isolation structures are located between the active regions;

forming first grooves in the active regions;

filling the first grooves to form inversion polysilicon layers, the inversion polysilicon layers being inversely doped with the active regions;

forming second grooves, the second grooves running through the inversion polysilicon layers and a part of the semiconductor substrate, and reserving parts of the inversion polysilicon layers located on side faces of the second grooves; and forming buried word line structures in the second grooves;

wherein, the step of forming the buried word line structures further comprises:

forming gate oxide layers on surfaces of the second grooves;

forming gate block layers on surfaces of the gate oxide layers, the gate block layers covering bottom surfaces and parts of side faces of the gate oxide layers;

forming gate conductive layers on surfaces of the gate block layers, the gate conductive layers filling parts of the second grooves; and forming insulating filling layers on the gate block layers and the gate conductive layers, the insulating filling layers filling remaining parts of the second grooves;

wherein, the steps of forming the gate block layers and forming the gate conductive layers comprise:

forming primary block layers on surfaces of the gate oxide layers;

forming primary conductive layers on surfaces of the primary block layers and filling the second grooves; and removing parts of the primary conductive layers and parts of the primary block layers, reserving second parts of the primary conductive layers and second parts of the primary block layers located in bottom regions of the second grooves to form the gate block layers and the gate conductive layers, a height of the parts of the primary conductive layers that are removed and the parts of the primary block layers that are removed is 20 nm to 150 nm.

2. The method according to claim 1, wherein, before the step of forming the first grooves in the active regions, the method further comprises: forming a patterned mask layer on a surface of the semiconductor substrate.

3. The method according to claim 1, wherein a depth of each of the first grooves is 20 nm to 150 nm, and a width of each of the first grooves is 30 nm to 100 nm.

4. The method according to claim 1, wherein a depth of each of the second grooves is 50 nm to 300 nm, and a width of each of the second grooves is 20 nm to 50 nm.

5. The method according to claim 1, wherein upper surfaces of the gate conductive layers are flush with upper surfaces of the gate block layers, and the upper surfaces of the gate block layers are not lower than lower surfaces of the parts of the inversion polysilicon layers located on the side faces of the second grooves.

6. A semiconductor device, comprising:

a semiconductor substrate, having active regions and trench isolation structures located between the active regions;

buried word line structures, located in the active regions, the buried word line structures comprise: gate oxide layers, gate block layers, gate conductive layers and insulating filling layers, the gate block layers being located on surfaces of the gate conductive layers, the insulating filling layers being located on the gate conductive layers and the gate block layers, and the gate oxide layers being located on surfaces of both the gate block layers and the insulating filling layers; and inversion polysilicon layers, located on side faces of the buried word line structures and inversely doped with the active regions, upper surfaces of the inversion polysilicon layers are flush with upper surfaces of the gate oxide layers, a thickness of each of the inversion polysilicon layers is 5 nm to 25 nm, and a height of each of the inversion polysilicon layers is 20 nm to 150 nm.

7. The semiconductor device according to claim 6, wherein upper surfaces of the gate block layers are flush with upper surfaces of the gate conductive layers and not lower than lower surfaces of the inversion polysilicon layers.

8. The semiconductor device according to claim 6, wherein a thickness of each of the gate block layers is 2 nm to 7 nm.

* * * * *